United States Patent
Halblaub et al.

(10) Patent No.: US 11,988,998 B2
(45) Date of Patent: May 21, 2024

(54) METHOD AND APPARATUS FOR COMPUTER AIDED SIMULATION OF A MODULAR TECHNICAL SYSTEM

(71) Applicant: Siemens Aktiengesellschaft, Munich (DE)

(72) Inventors: Andrés Botero Halblaub, Kirchseeon (DE); Veronica Brandstetter, Munich (DE); Markus Graube, Dresden (DE); Till Heinzerling, Karlsruhe (DE); Stephan Hensel, Dresden (DE); Anselm Klose, Dresden (DE); Jonathan Maedler, Dresden (DE); Tim Schenk, Landshut (DE); Leon Urbas, Berlin (DE); Jan Christoph Wehrstedt, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 439 days.

(21) Appl. No.: 17/292,300

(22) PCT Filed: Oct. 30, 2019

(86) PCT No.: PCT/EP2019/079651
§ 371 (c)(1),
(2) Date: May 7, 2021

(87) PCT Pub. No.: WO2020/094476
PCT Pub. Date: May 14, 2020

(65) Prior Publication Data
US 2021/0397146 A1   Dec. 23, 2021

(30) Foreign Application Priority Data
Nov. 9, 2018   (EP) .................................. 18205462

(51) Int. Cl.
G05B 17/02 (2006.01)

(52) U.S. Cl.
CPC .................................... G05B 17/02 (2013.01)

(58) Field of Classification Search
CPC .......... G05B 17/02; G05B 2219/23456; G05B 19/41885; G06F 30/20; Y02P 90/02
See application file for complete search history.

(56) References Cited

U.S. PATENT DOCUMENTS 10,360,327 B2 *  7/2019  Clark ...................... G06F 30/20
10,892,058 B2 *  1/2021  Schmidt ................ G06T 7/0012
(Continued)

FOREIGN PATENT DOCUMENTS

| CN | 102692876 A | 9/2012 |
| CN | 104635508 A | 5/2015 |
| WO | 2011026021 A2 | 3/2011 |

OTHER PUBLICATIONS

WO2020094476—Method and Device for Computer-Assisted Simulation of a Modular Technical System; English Translation of the Written Opinion of the International Searching Authority; Sep. 5, 2021.*

(Continued)

*Primary Examiner* — Ramesh B Patel
(74) *Attorney, Agent, or Firm* — Schmeiser, Olsen & Watts LLP (57) ABSTRACT

A method and a device for the computer-assisted simulation of a modular technical system, wherein for each real module of the modular technical system, a corresponding virtual module is generated, is provided. The virtual module includes a controller for controlling a module-specific process and at least one module-specific simulation model, to which model type information is assigned, for simulating the model-specific process. The virtual module is designed to simulate the module-specific process that is controlled by (Continued)

the controller by means of the module-specific simulation model and/or the controller of the real module, and is provided for a computer-assisted simulation of the modular technical system as a data container. In particular, the following allows a virtual start-up of modular process systems.

12 Claims, 3 Drawing Sheets

(56) References Cited

U.S. PATENT DOCUMENTS

| | | | |
|---|---|---|---|
| 11,018,950 B2* | 5/2021 | Poort | G06F 9/5066 |
| 11,726,463 B2* | 8/2023 | Nixon | G05B 19/4185 700/29 |
| 2012/0239374 A1 | 9/2012 | Mutyalapati et al. | |
| 2015/0134313 A1* | 5/2015 | Maturana | G06F 9/541 703/6 |
| 2015/0134317 A1 | 5/2015 | Maturana et al. | |
| 2019/0114376 A1* | 4/2019 | Ashdown | G06N 20/00 |
| 2020/0019137 A1* | 1/2020 | Tsai | G05B 19/4062 |
| 2020/0244544 A1* | 7/2020 | Poort | H04L 47/83 |
| 2020/0387147 A1* | 12/2020 | Nixon | G05B 19/41885 |
| 2021/0343186 A1* | 11/2021 | Lampotang | G09B 23/285 |
| 2022/0019205 A1* | 1/2022 | Nixon | G05B 19/41835 |
| 2022/0198101 A1* | 6/2022 | Linehan | G06F 30/20 |
| 2023/0013700 A1* | 1/2023 | Strohmenger | G05B 17/02 |

OTHER PUBLICATIONS

Deliverable D1: "AVANTI—Test methodology for virtual commissioning based on behaviour simulation of production systems," XP055179868, Gefunden im Internet: URL:http://www.avanti-project.de/files/AVANTI_D1_1 State of the Art public.pdf; [gefunden am Mar. 27, 2015]; sections 1, 2, 3.1, 3.2,5; 2014; 50 pages.

Bergert, Martin et al: "Durchgängige Verhaltensmodellierung von Betriebsmitteln zur Erzeugung digitaler Simulationsmodelle von Fertigungssystemen," atp edition—Automatisierungstechnische Praxis vol. 50, No. 07 (2008), pp. 61-66, XP055593046, Gefunden im Internet: URL:http://ojs.di-verlag.de/index.php/atp_edition/article/view/2058, [gefunden am May 29, 2019]; the whole document; 2008; 7 pages. With English Abstract.

International Search Report and Written Opinion for corresponding PCT International Patent Application No. PCT/EP2019/079651 dated Jan. 9, 2020. 15 pages.

Süß Sebastian et al.; "Test methodology for virtual commissioning based on behaviour simulation of production systems"; 2016 IEEE 21st International Conference on ETFA; Dec. 31, 2016.

* cited by examiner

METHOD AND APPARATUS FOR COMPUTER AIDED SIMULATION OF A MODULAR TECHNICAL SYSTEM

CROSS-REFERENCE TO RELATED APPLICATIONS

This application is a national stage entry of PCT Application No. PCT/EP2019/079651 having a filing date of Oct. 30, 2019, which claims priority to European Patent Application No. 18205462.7, having a filing date of Nov. 9, 2018, the entire contents of which are hereby incorporated by reference.

FIELD OF TECHNOLOGY

The following relates to a method and an apparatus for computer-aided simulation of a modular technical system, wherein a corresponding virtual module is generated for a respective real module of the technical system.

BACKGROUND

Modular process installations can in particular be used increasingly in process engineering, such as e.g. in the chemical or pharmaceutical industry. Process engineering modules, also referred to as modular process units (process equipment modules), are normally used for this, these being self-contained and able to be connected up by a module integrator to form complex overall installations. The interconnection of modules allows a reduction in the planning and modification time for new installations. The modules can normally each comprise separate control or automation engineering that can be controlled during operation of the modular installation by a central process orchestration layer on the basis of capability or across modules without a process orchestration layer. The module types can be described using standard description languages, such as for example the Module Type Package, MTP for short, standard, which describes the interfaces, services and functions of the automation engineering of the modules and allows integration of the modules in a process orchestration layer.

Before a real commissioning of a modular process installation, a virtual commissioning can take place. This can be realized for example by means of genuine ("Hardware-in-the-Loop", HiL for short) or emulated ("Software-in-the-Loop", SiL for short, or "Model-in-the-Loop", MiL for short) control and/or as a simulation of the process behavior. The virtual commissioning for each module therefore requires simulation models of the process and emulations of the automation engineering, these being able to be orchestrated in accordance with the installation topology. Normally, the required simulation models and emulations are not present, are not included within the scope of delivery by the module manufacturer and/or are based on different software. A virtual commissioning of an installation comprising modules from different manufacturers accordingly entails a large amount of effort or is impossible, since the automation engineering integrated in the module and/or the process may be known to only one manufacturer.

SUMMARY

An aspect of the present invention is to facilitate a virtual commissioning of a modular technical system, in particular of a modular process installation.

According to a first aspect, the present invention relates to a method for computer-aided simulation of a modular technical system, wherein a processor for a respective real module of the modular technical system is used a) to read in module-specific data of the real module and to take the module-specific data as a basis for generating a corresponding virtual module that comprises a controller for controlling a module-specific process and at least one module-specific simulation model, which has associated model type information, for simulating the module-specific process and that is designed to replicate the module-specific process controlled by the controller, by means of the module-specific simulation model, and/or the controller of the real module, and b) to provide the virtual module as a data container for a computer-aided simulation of the modular technical system.

The method according to the present invention can be realized in particular as a computer-implemented method. In particular, the method can be carried out by an apparatus that comprises at least one processor.

Within the context of the present invention, a processor can be understood to mean for example a machine or an electronic circuit. A processor can be in particular a central processing unit (CPU), a microprocessor or a microcontroller, for example an application-specific integrated circuit or a digital signal processor, possibly in combination with a memory unit for storing program commands, a server, etc.

Within the context of the present invention, a "modular technical system" can be understood to mean in particular a modular installation, a modular process installation or a modular production installation. The modular technical system comprises at least one module. Within the context of the present invention, a "module" can be understood to mean in particular a hardware module, a sub installation or an installation module, such as e.g. devices or pumps. A module can also be referred to as a modular process unit (process equipment module). Component parts of the module can be in particular actuators, sensors, process engineering connections, control and communication interfaces and separate automation engineering.

Within the context of the present invention, a "virtual module" can be understood to mean a data container, in particular having a fixed (data) structure, a predefined interchange format or a data structure, which in particular may be partially executable. A virtual module in particular reproduces a real module, i.e. it comprises virtual or simulated parts of the real module. In particular, the virtual module can comprise at least one controller and a module-specific simulation model, wherein at least one description, e.g. relating to details and executability, is assigned in each case. The controller and the at least one simulation model of the virtual module can be coupled to one another in the virtual module by way of a communication layer, as a result of which for example control data can be transferred from the controller to the simulation model.

A "computer-aided simulation" can be understood to mean in particular a simulation of the operation and/or processes of a modular technical system and/or a virtual commissioning. A virtual commissioning comprises for example various tests, such as e.g. signal tests, a test on the field devices or on the process behavior. The test on the process behavior can involve in particular various processed media or materials being modelled. In addition, a virtual commissioning can be used to test the control or automation engineering of a module or of the entire installation. In particular just the real automation or control hardware can be used, i.e a so-called "Hardware-in-the-Loop" approach can be taken. Alternatively, an emulation of the automation or control engineering, i.e. so-called "Software-in-the-Loop" or "Model-in-the-Loop" approaches, can also be realized. To this end, the virtual module comprises a controller, which can also be referred to as a virtual controller, and which in particular can be present as a hardware project or as an emulation. If the controller of the virtual module is present as a hardware project, the virtual module can be coupled to a real controller, which at least corresponds to the controller of the real module. Alternatively, the controller can also be present in the virtual module as an emulation.

A virtual module according to the present invention can be generated for a respective real module and included within the scope of delivery by a module manufacturer. Data, in particular module-specific data, such as e.g. configuration and/or specification data, of the real module are ascertained and read in. The data can be captured by means of a sensor or derived from a description of the real module, for example. These module-specific data are taken as a basis for generating the virtual module. In particular, the virtual module comprises at least one module-specific simulation model together with associated model type information. The simulation model comprises for example information relating to the process engineering, to actuators or sensors, to process engineering connections, communication for control, simulated physical interfaces and control options, input/output interfaces for cross-model interchange of variables or parameters and the like. The module-specific simulation model can in particular be pre-generated and/or preconfigured and provided in this way. By way of example, a module manufacturer can generate at least one corresponding simulation model. The virtual module comprises a multiplicity of module-specific simulation models that each have associated model type information, e.g. in order to be easily able to carry out different kinds of simulations.

The module-specific simulation model and/or the controller of the virtual module can for example also be realized as a link to a manufacturer homepage and/or an IP address for direct execution on a manufacturer server.

An advantage of the present invention is that a virtual module comprises the necessary information to easily configure and simulate a modular installation virtually in a simulation environment. By way of example, a change in a configuration of the real modular installation can result in virtual models being used to perform a check on the installation configuration virtually.

A standardized methodology and a specified encapsulation of the individual parts of the virtual module in a data container allow the creation of a virtual commissioning of a modular technical system to be automated, and it is in particular possible to realize said virtual commissioning independently of specific simulation software. Modelling complexity can be reduced and/or modelling errors can be avoided, since the virtual module can comprise all the required information for simulating the modular installation, said information being provided as data containers. For real modules from different manufacturers, a virtual commissioning can be created without further effort and/or specific simulation tools.

In one advantageous embodiment of the method, the model type information can comprise details relating to the type of simulation model, relating to the execution and/or relating to the level of detail of the simulation model.

Model type information can be understood to mean in particular a description of the respective module-specific simulation model. In order to achieve for example automated integration of the module-specific simulation models in the simulation environment, it is advantageous to include an accurate description of a module-specific simulation model within the scope of delivery.

In one advantageous embodiment of the method, the module-specific simulation model can have a first interface by way of which cross-model variables of the module-specific simulation model are interchanged.

In particular, each module-specific simulation model integrated in the virtual module can have at least one first interface. The first interface can be used in particular to interchange variables across models. Variables can be defined as cross-module or module-internal and can comprise for example physical quantities or signals. The first interface can be used to set up a coupling to other virtual modules, for example in order to establish the modular technical system virtually. The first interface therefore comprises in particular those couplings, e.g. in order to interchange signals or physical quantities, that the real module likewise has.

In one advantageous embodiment of the method, the module-specific simulation model can have a second interface by way of which parameter values and/or functions for the module-specific simulation model can be read in and the module-specific simulation model is configured thereby.

In particular, each module-specific simulation model integrated in the virtual module can have at least one second interface. This second interface can be used in particular to read in parameter values and/or functions and/or secondary simulation models. Secondary simulation models can be for example encapsulated in functions and called by a module-specific simulation model in this way. A secondary simulation model can comprise for example a simulation of reaction kinetics. By way of example, the second interface can be used to input customer-specific parameter values, parameterized functions or the like for a simulation model. In particular, access to a database can be realized. The module-specific simulation model can be configured by means of the inputs via the second interface and subsequently executed.

In one advantageous embodiment of the method, the module-specific simulation model can comprise a third interface for cross-module communication and the third interface can be used to read in and/or read out state data of a module-specific simulation model.

The virtual module comprises at least one third interface, analogously to the real module. A third interface can be realized for example as a communication interface, a user interface (human-machine interface) or a connection to a central control or process orchestration layer. The third interface can be used to interchange in particular state data required for a virtual commissioning. By way of example, error states can be read out or set. The third interface in particular allows a data transfer or a data interchange, such as e.g. the input of control commands. Additionally, the third interface allows an input of state data and/or an output of state data of a simulation model. State data comprise in particular states of a simulation model at a specific time. By way of example, error and/or validation states of the simulation model can be set and/or read out in this way.

In one advantageous embodiment of the method, state data of a module-specific simulation model can be output by way of an evaluation unit.

An evaluation unit can be for example a control image for displaying states or the like. In particular, internal state data of a simulation model can be displayed.

In one advantageous embodiment of the method, a further module-specific simulation model, which has further associated model type information, can be integrated in the virtual module.

The virtual module is designed such that further module-specific simulation models can be incorporated. This allows for example further simulation types to be established by means of the virtual module.

In one advantageous embodiment of the method, the virtual module can be encapsulated and/or encrypted and can be provided in this way.

The virtual module can be provided as an encapsulated and/or encrypted data container, for example. In particular, a known method for data encapsulation and/or cryptographic encryption of data can be used.

In one advantageous embodiment of the method, it is possible for
a) predefined configuration information of the modular technical system to be taken as a basis for selecting real modules of the technical system, providing corresponding virtual modules for the selected real modules and reading said virtual modules into a simulation environment, and
b) the virtual modules to be coupled to one another in the simulation environment on the basis of the configuration information and a computer-aided simulation of the modular technical system can be executed, wherein predefined simulation type information for each virtual module is taken as a basis for replicating a module-specific process controlled by the respective controller, by means of a respective module-specific simulation model, the associated model type information of which complies with the simulation type information, and/or the controller of a respective module-specific process.

Simulation type information can in particular be provided or predefined by an installation integrator on the basis of the requirements for the simulation of the modular technical system. It comprises for example the type of test, such as e.g. signal test, field device test, or automation test.

The modular technical system can be simulated in a simulation environment or a simulator by means of the virtual modules for each real module present. The virtual modules comprise all the information required for establishing and carrying out a simulation. The configuration and/or topology of the virtual installation comprising the virtual modules is effected according to the configuration information of the real installation. In particular, a comparison of the simulation type information and the model type information can be used to ascertain the simulation model required.

In one advantageous embodiment of the method, the technical system can be configured and/or controlled on the basis of a result of the executed simulation of the modules.

A further aspect of the present invention relates to an apparatus for computer-aided simulation of a modular technical system, which has at least one processor designed to perform a method according to the present invention.

In addition, the embodiment of the present invention relates to a computer program product (non-transitory computer readable storage medium having instructions, which when executed by a processor, perform actions) that can be loaded directly into a programmable computer, comprising program code parts that, when the program is executed by a computer, prompt the latter to perform the method/the steps of a method, and to a computer-readable storage medium having a computer program product according to the present invention.

A computer program product can be provided or supplied for example on a storage medium, such as e.g. memory card, USB stick, CD-ROM, DVD, a nonvolatile/permanent storage medium (non-transitory storage medium) or else in the form of a downloadable file from a server in a network.

BRIEF DESCRIPTION

Some of the embodiments will be described in detail, with reference to the following figures, wherein like designations denote like members, wherein.

DETAILED DESCRIPTION

Mutually corresponding items are provided with the same reference signs throughout the figures.

In particular, the exemplary embodiments that follow merely show illustrative realization possibilities, how in particular such realizations of the teaching according to the embodiment of the present invention could be manifested, since it is impossible and also not helpful or necessary for the understanding of the present invention to name all these realization possibilities.

Moreover, in particular a (relevant) person skilled in the art, with knowledge of the method claim/method claims, is of course aware of all routine possibilities for realizing the present invention in the prior art, and so there is no need in particular for independent disclosure in the description. In particular, these customary realization variants known to the person skilled in the art can be realized exclusively by hardware (components) or exclusively by software (components). Alternatively and/or additionally, the person skilled in the art, within the scope of his/her expert ability, can choose to the greatest possible extent arbitrary combinations according to the embodiment of the present invention of hardware (components) and software (components) in order to implement realization variants according to the present invention.

Figure 1:
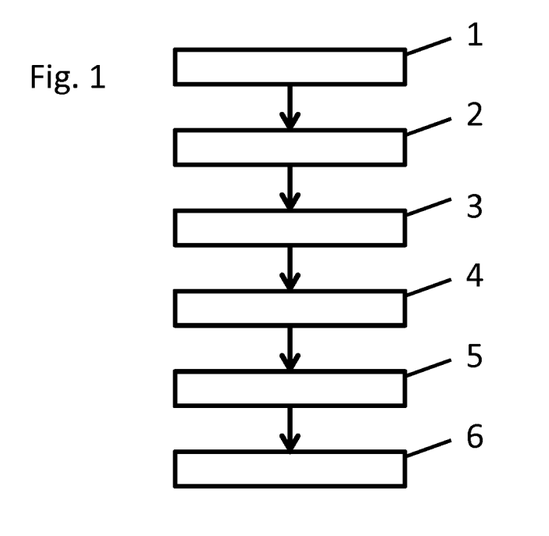
FIG. 1: depicts a flowchart for a method.

FIG. 1 shows an exemplary embodiment of a method according to the present invention for computer-aided simulation of a modular technical system. A modular technical system can be in particular a process installation of modular design, for example for the chemical or pharmaceutical industry. The method can be realized in particular as a computer-implemented method, with steps of the method being performed by a processor at least in some cases.

A modular technical system can comprise multiple modules, which may be configured to be interchangeable. The modules can in particular each comprise separate control or automation engineering that controls sensors and/or actuators of the module, for example. Various modules can be coupled to one another by way of physical interfaces. A module can perform a process step of a process and/or merely part of a process step, for example. The control of a process of a modular technical system can be controlled in particular by way of a central process orchestration layer that controls the control of a respective module.

Before a commissioning of the modular technical system, it is possible for a simulation of the technical system, i.e. a virtual commissioning, to be effected. This can be for example a pure signal test, a test on the field device layer, a test on the process dynamics or a transient test on the process behavior. In particular various control actions, various system specifications and/or error scenarios can be played through. A virtual commissioning can be effected in a suitable engineering environment or simulation environment.

Figure 3:
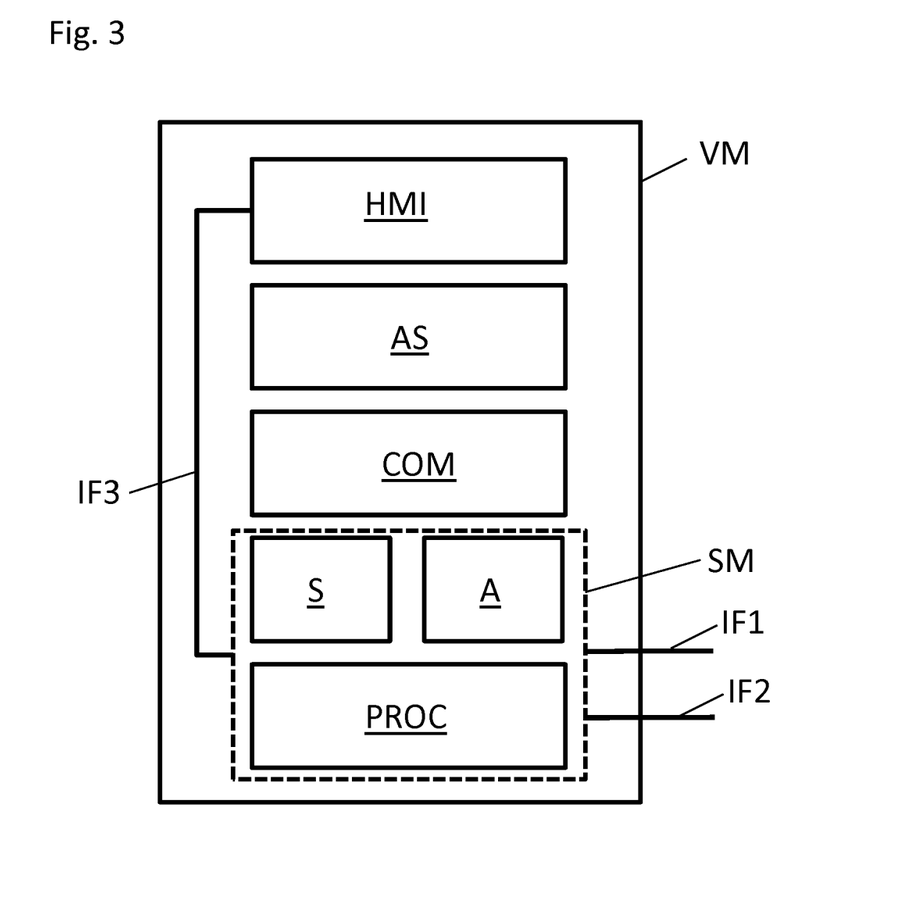
FIG. 3: depicts a schematic depiction of a structure of a virtual module integrated in a simulation environment.

In the first step S1 of a method according to the embodiment of the present invention, a virtual module is generated for a respective real module of the modular technical system on the basis of module-specific data of the corresponding real module. The module-specific data of the real module can be configuration data or specification data, for example. A virtual module can be realized as a data container, in particular as a data structure, an executable data structure having a firmly predefined structure, as depicted in FIG. 3, for example.

A virtual module is designed in particular such that it can replicate or simulate a module-specific process, by means of a module-specific simulation model, and/or the controller of the corresponding real module. Since a virtual module comprises both a controller and at least one module-specific simulation model, it can be used to establish a simulation of the corresponding real module in a simulation environment.

A virtual module comprises a plurality of module-specific simulation models that each have associated model type information. The module-specific simulation models can in particular be generated beforehand. They reproduce a process taking place in the module, for example.

In addition, the virtual module comprises an emulated controller or a control project, including an interface for interfacing with a real controller for controlling a module-specific process. Additionally, the virtual module can comprise a third interface for cross-module communication. The third interface can be used to connect up the virtual module, in particular in a simulation environment, to other virtual modules to form a virtual installation. Additionally, the third interface permits a data interchange beyond module boundaries, such as e.g. the output of state data of a module-specific simulation model to an evaluation unit.

The virtual module is generated analogously to the real module in each case, i.e. the virtual module comprises in particular a reproduction of all control options, interfaces, capabilities and functions like the real module, and accordingly permits a simulation of the overall modular technical system to be realized. In particular, the virtual module comprises a multiplicity of different simulation models with different model type information, as a result of which for example different types of simulations of the module and/or of the modular installation can be carried out. In addition, the virtual module contains a controller, which can be in the form of an emulated controller, for example. The virtual module can in particular be provided as an encapsulated and/or encrypted data container.

A virtual module is designed such that it can be assembled together with other virtual modules in a simulation environment to form a virtual technical system. A virtual module comprises a module-individual controller and at least one module-specific simulation model, which are advantageously coupled to one another by way of a communication layer, as a result of which the real module, the controller of the real module and/or a process of the real module can be simulated.

A manufacturer of a real module of a process engineering installation provides a respective virtual module, together with a standardized description, such as e.g. an MTP description, of the real module, as a data container, step S2. By way of example, the virtual modules can be stored on a memory unit, a database or on a server.

Hereinafter, the simulation of the modular technical system can be established and executed. To this end, in the next step S3, all real modules are identified for a modular technical system that is to be simulated, and corresponding virtual models are provided for said real modules. This is effected on the basis of predefined configuration information of the modular technical system, which comprises e.g. information about the installation topology from the process orchestration layer, information about links between the modules and the variable interchange thereof and/or information from e.g. the MTP description. Additionally, predefined simulation type information is used in step S3 to determine what type of simulation and/or what type of control is supposed to be executed.

The virtual modules provided are read into a suitable simulation environment. By way of example, a commissioning engineer or installation integrator of a modular process installation can read the virtual modules into a suitable engineering environment.

In the next step S4, the virtual modules are coupled to one another in the simulation environment on the basis of the configuration information, i.e. interfaces of the simulation models are connected to one another such that variables can be interchanged. A commissioning engineer or installation integrator can therefore take the configuration information as a basis for establishing a virtual reproduction of the modular technical system. To this end, in particular, the simulation model of a respective virtual module whose model type information corresponds to or complies with predefined simulation type information is selected in each case. The simulation type information in particular determines the type of virtual commissioning, such as e.g. signal test, process test, Hardware-in-the-Loop, Software-in-the-Loop or Model-in-the-Loop, for the controller. Additionally, the simulation type information is taken as a basis for ascertaining what type of controller is configured.

The virtual modules are connected up to one another in the simulation environment, the applicable simulation models and/or the applicable control type being selected and configured for a respective virtual module according to the simulation type information.

Before the simulation is executed, i.e. before a virtual commissioning, the installation integrator can set parameter values and/or functions for the respective module-specific simulation models by way of in each case the second interface thereof, step S4. In particular, parameters and/or functions that are not stipulated by the manufacturer of a module can be defined. By way of example, customer-specific parameters, such as e.g. materials data, can be read in and the respective module-specific simulation model can be configured accordingly.

The modular technical system can be simulated by means of the established simulation on the basis of the virtual modules. In particular, various error scenarios and/or the process behavior can be simulated in computer-aided fashion, step S5. Internal state data of a module-specific process simulation model can be output to an evaluation unit, such as e.g. a control image.

In addition, it is possible to use the third interface of a respective virtual module to read out and read in state data of a module-specific simulation model. By way of example, state data of a module-specific process simulation model can be set to predefined values in order to simulate an error scenario.

On the basis of the result of the simulation of the modular technical system, the latter can be commissioned, configured according to the configuration information and/or controlled. Step S6 of the method comprises transmission of the result of the virtual commissioning to e.g. an installation integrator.

Figure 2:
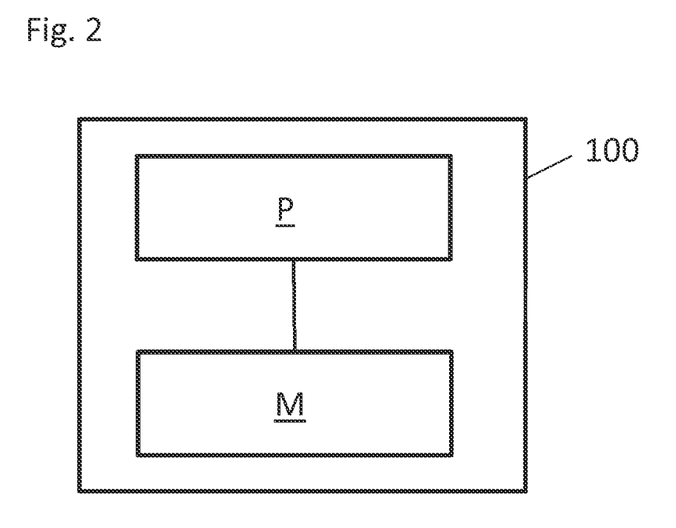
FIG. 2: depicts a schematic depiction of an apparatus.

FIG. 2 shows a block diagram of an apparatus 100 according to the embodiment of the present invention. The apparatus 100 is configured to perform a method according to the present invention. In particular, the apparatus 100 comprises at least one processor P that performs at least one method step of the method. In addition, the apparatus 100 according to the present invention can comprise at least one memory unit M in order to store and provide at least one virtual module, in particular.

FIG. 3 shows a schematic depiction of a virtual module VM, following integration in a simulation environment, that, having been generated using a method according to the embodiment of the present invention, is coupled to other virtual modules according to configuration information of the modular technical system in order to allow a simulation of a modular technical system. The virtual module VM in particular replicates a corresponding real module, i.e. it comprises in particular all the components and capabilities of a real module and is in particular designed to execute various simulation scenarios. The virtual module VM accordingly allows various simulation types to be realized for the virtual commissioning. A virtual module VM is provided as a data container. The data container is generated with a predefined structure.

A virtual module VM comprises at least one simulation model SM that replicates or simulates a module-specific process PROC and the interfacing with actuators A and/or sensors S. The module-specific simulation model SM in particular comprises information relating to process engineering, actuators, sensors, process engineering connections, communication, and input/output interfaces for cross-model interchange of variables/parameters.

The module-specific simulation model SM is described by associated model type information. The model type information is provided using the simulation model SM. The model type information can be coded across models, for example. The model type information in particular comprises details relating to the type of simulation model, such as e.g. signal test or process dynamics test, relating to the execution or executability and/or relating to the level of detail of the simulation model SM. The virtual model VM comprises a multiplicity of module-specific simulation models SM that each differ in terms of level of detail, for example.

Each module-specific simulation model SM comprises in particular at least a first interface IF1 and a second interface IF2. The first interface IF1 allows the interchange of cross-module variables of the module-specific simulation model SM. Cross-module variables can be interchanged in particular across modules and/or internally in modules. In other words, the first interface IF1 can be regarded as a simulated physical interface and control option. The second interface IF2 in particular allows a configuration of the respective simulation model SM. The second interface IF2 thus permits in particular access to the virtual module VM from outside. The virtual module VM and/or the simulation models SM can in particular comprise further interfaces.

In addition, the virtual module VM comprises a controller AS, which is present either as an emulation, as a control project, as a simplified model of the control logic or simplified functional automation logic. A control project can be realized as a file, for example. The controller can in particular have associated control type information on the basis of which the type of controller and the capabilities can be derived. An emulation of the controller can be understood as a reproduction of the real controller. The controller AS of the virtual module VM is coupled to the process simulation by way of a communication layer COM. The communication can be effected according to a communication protocol, for example. Additionally, the third interface IF3 of the virtual module VM is coupled to the at least one module-specific simulation model SM. The third interface IF3 can be used for example to read out state data of a module-specific simulation model SM and to transmit said state data to an evaluation unit or to a control image HMI.

The executability of the simulation model SM and/or of the controller AS can in particular exist in different variants. The execution can be effected in tool-specific fashion, for example, i.e. the execution requires a defined tool, such as e.g. simulation software. Alternatively, the execution can be effected in tool-unspecific fashion, i.e. the simulation models and/or the controller are provided according to a defined standard format, as a result of which they can be loaded into various simulation tools and executed there. Additionally, simulation models and/or the controller can be defined such that they are provided in self-executable fashion, i.e. for example as a standardized executable, for which a specified tool is not required for execution. The executability of the simulation models and control models is defined for each virtual module.

The data container of a virtual module VM can be structured according to a tree structure, for example. The format and structure of a virtual module VM are the same for every virtual module and therefore compatible with one another.

By way of example, the tree structure can comprise a folder structure, which for example may be compatible with a standardized description such as the MTP description. By way of example, all available module-specific simulation models, corresponding controller variants and available overall models, comprising a coupling table for coupling a controller and a simulation model, can be listed in one folder layer. In particular, the implementation, i.e. tool-specific, tool-unspecific or executable, can be defined per simulation model and controller. Each module-specific simulation model is assigned model type information, which can be realized as an XML file, for example.

All features described and/or shown can be advantageously combined with one another within the context of the embodiment of the present invention. The present invention is not restricted to the exemplary embodiments described.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

What is claimed:

1. A method for computer-aided simulation of a modular technical system, wherein a processor for a respective real module of the modular technical system is configured to:
   a) generate a virtual module that corresponds to a real module of the modular technical system based on module-specific data of the real module, wherein the virtual module comprises:
      a controller for controlling a module-specific process, and
      at least one module-specific simulation model, which has associated model type information for simulating the module-specific process, wherein the at least one module-specific simulation model has a first interface that allows cross-module variables of the module-specific simulation model to be interchanged across modules;
wherein the controller of the corresponding virtual module replicates the module-specific process based on the module-specific simulation model, or replicates a controller of the real module;

b) to store the virtual module as a data container for a computer-aided simulation of the modular technical system;

c) select real modules of the modular technical system that are to be simulated based on predefined configuration information of the modular technical system, and provide corresponding virtual modules for the selected real modules;

d) coupling the corresponding virtual modules of the selected real modules to one another in a simulation environment on a basis of the predefined configuration information such that the first interface of each of the corresponding virtual modules are connected together to interchange the cross-module variables; and e) executing the computer-aided simulation of the modular technical system, wherein predefined simulation type information for each virtual module is taken as a basis for replicating a module-specific process controlled by the respective controller.

2. The method as claimed in claim 1, wherein the model type information comprises details relating to the type of simulation model, relating to the execution and/or relating to the level of detail of the simulation model.

3. The method as claimed in claim 1, wherein the module-specific simulation model has a second interface by way of which parameter values and/or functions for the module-specific simulation model are read in and the module-specific simulation model is configured thereby.

4. The method as claimed in claim 1, wherein the module-specific simulation model comprises a third interface for cross-module communication and the third interface is used to read in and/or read out state data of a module-specific simulation model.

5. The method as claimed in claim 4, wherein state data of a module-specific simulation model are output by way of an evaluation unit.

6. The method as claimed in claim 1, wherein a further module-specific simulation model, which has further associated model type information, is integrated in the virtual module.

7. The method as claimed in claim 1, wherein the virtual module is encapsulated and/or encrypted and is provided in this way.

8. The method as claimed in claim 1,
wherein replicating the module-specific process controlled by the respective controller is done by means of a respective module-specific simulation model, the associated model type information of which complies with the simulation type information, and/or the controller of a respective module-specific process.

9. The method as claimed in claim 1, wherein the technical system is configured and/or controlled on the basis of a result of the executed simulation of the modules.

10. An apparatus for computer-aided simulation of a modular technical system, which has at least one processor designed to perform a method as claimed in claim 1.

11. A computer program product comprising a computer readable hardware storage device having computer readable program code stored therein, said program code executable by a processor of a computer system to implement the method as claimed in claim 1.

12. A computer-readable storage medium having a computer program product as claimed in claim 11.

* * * * *